United States Patent
Tian (10) Patent No.: US 7,466,877 B2
(45) Date of Patent: Dec. 16, 2008

(54) MONITORING MODULATION ALIGNMENT VARIATION USING PHOTON ABSORPTION

(75) Inventor: Cechan Tian, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 272 days.

(21) Appl. No.: 11/233,652

(22) Filed: Sep. 23, 2005

(65) Prior Publication Data

US 2007/0070487 A1    Mar. 29, 2007

(51) Int. Cl.
G02F 1/295  (2006.01)
G02B 6/26  (2006.01)
G02B 6/12  (2006.01)

(52) U.S. Cl. ................... 385/4; 385/15; 385/14
(58) Field of Classification Search ............. 385/4, 385/15, 14
See application file for complete search history.

(56) References Cited

U.S. PATENT DOCUMENTS

| | | | |
|---|---|---|---|
| 7,224,858 B2 * | 5/2007 | Welch et al. | 385/14 |
| 2003/0095736 A1 * | 5/2003 | Kish et al. | 385/14 |
| 2003/0095737 A1 * | 5/2003 | Welch et al. | 385/14 |
| 2004/0067006 A1 * | 4/2004 | Welch et al. | 385/14 |
| 2005/0047601 A1 * | 3/2005 | Shields et al. | 380/283 |
| 2005/0063636 A1 * | 3/2005 | Joyner | 385/14 |
| 2005/0094927 A1 * | 5/2005 | Kish et al. | 385/14 |
| 2007/0070486 A1 * | 3/2007 | Tian et al. | 359/239 |

OTHER PUBLICATIONS

Sinsky, Jeffrey H., "*High-Speed Data and Pulse-Carver Alignment in Dual Mach-Zehnder Modulator Optical Transmitter Using Microwave Signal Processing*," Journal of Lightwave Technology, vol. 21, No. 2, pp. 412-423, Feb. 2003.

"*Fujitsu Gigabit Ethernet VOD Solutions*," The Possibilities Are Infinite, © 2004 Fujitsu Network Communications, Inc., cover plus 9 pages, 2004.

"Flashwave 7500," Metro/Regional ROADM Platform, Flashwave7500/DS/3.0/03.05/CM, The Possibilities Are Infinite, © 2005 Fujitsu Network Communications, Inc., 2 pages, 2005.

Ku, Yuen-Ching, et al., "*A Novel Technique for Modulation Alignment Monitoring in RZ-DPSK Systems Using Off-Center Optical Filtering*," OWJ4, © 2005 Optical Society of America, 3 pages, 2005.

"Flashwave 7500," *Reconfigurable Optical Add/Drop Multiplexer*, The Possibilities Are Infinite, http://www.fujitsu.com/us/services/telecom/flashwave-7500html, © Fujitsu 2000-2005, 2 pages, Printed Sep. 16, 2005.

Pending Patent Application entitled, "*Monitoring Modulator Bias Using Photon Absorption*", 30 pages specification, claims and abstract, 5 pages of drawings, inventors Cechan (nmi) Tian, et al., Sep. 23, 2005.

* cited by examiner

*Primary Examiner*—Kianni C. Kaveh
(74) *Attorney, Agent, or Firm*—Baker Botts L.L.P.

(57) ABSTRACT

Monitoring modulation alignment variation of optical modulators includes receiving an optical signal at an input fiber. The optical signal has been modulated by optical modulators. Photons of the optical signal are received at a photon reactive material operable to produce a reaction in response to the arrival of a predetermined number of photons. Reactions are produced in response to the arrival of the photons of the optical signal. Feedback is generated in response to reactions. The feedback reflects the waveform of the optical signal, and indicates modulation alignment variation among the optical modulators.

19 Claims, 5 Drawing Sheets

MONITORING MODULATION ALIGNMENT VARIATION USING PHOTON ABSORPTION

TECHNICAL FIELD

This invention relates generally to the field of optical networks and more specifically to monitoring modulation alignment variation using photon absorption.

BACKGROUND

A communication network may communicate information using optical signals transmitted as light pulses. Certain devices of a communication network may include optical modulators that modulate the optical signals. Signals that drive the optical modulators typically should be aligned in time in order to properly modulate the signals. The relative delay between driving signals, however, may change due to, for example, temperature variation or device wear. Known alignment variation monitoring techniques involve using optical filtering or microwave signal processing to monitor drift in the relative delay. These known techniques, however, are not satisfactory in certain situations.

SUMMARY OF THE DISCLOSURE

In accordance with the present invention, disadvantages and problems associated with previous techniques for monitoring optical modulation may be reduced or eliminated.

According to one embodiment of the present invention, monitoring modulation alignment variation of optical modulators includes receiving an optical signal at an input fiber. The optical signal has been modulated by optical modulators. Photons of the optical signal are received at a photon reactive material operable to produce a reaction in response to the arrival of a predetermined number of photons. Reactions are produced in response to the arrival of the photons of the optical signal. Feedback is generated in response to reactions. The feedback reflects the waveform of the optical signal, and indicates modulation alignment variation among the optical modulators.

Certain embodiments of the invention may provide one or more technical advantages. A technical advantage of one embodiment may be that modulation alignment variation may be monitored by detecting the waveform of the modulated signal. According to the embodiment, certain changes in the waveform of the modulated signal may indicate variation in the modulation alignment. Another technical advantage of one embodiment may be that the changes in the waveform is independent of the data rate, so modulation alignment variation may be monitored for any suitable data rate. Yet another technical advantage of one embodiment may be that the changes in the waveform is independent of the wavelength, so modulation alignment variation may be monitored for any suitable wavelength.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 8 of the drawings, like numerals being used for like and corresponding parts of the various drawings.

Figure 1:
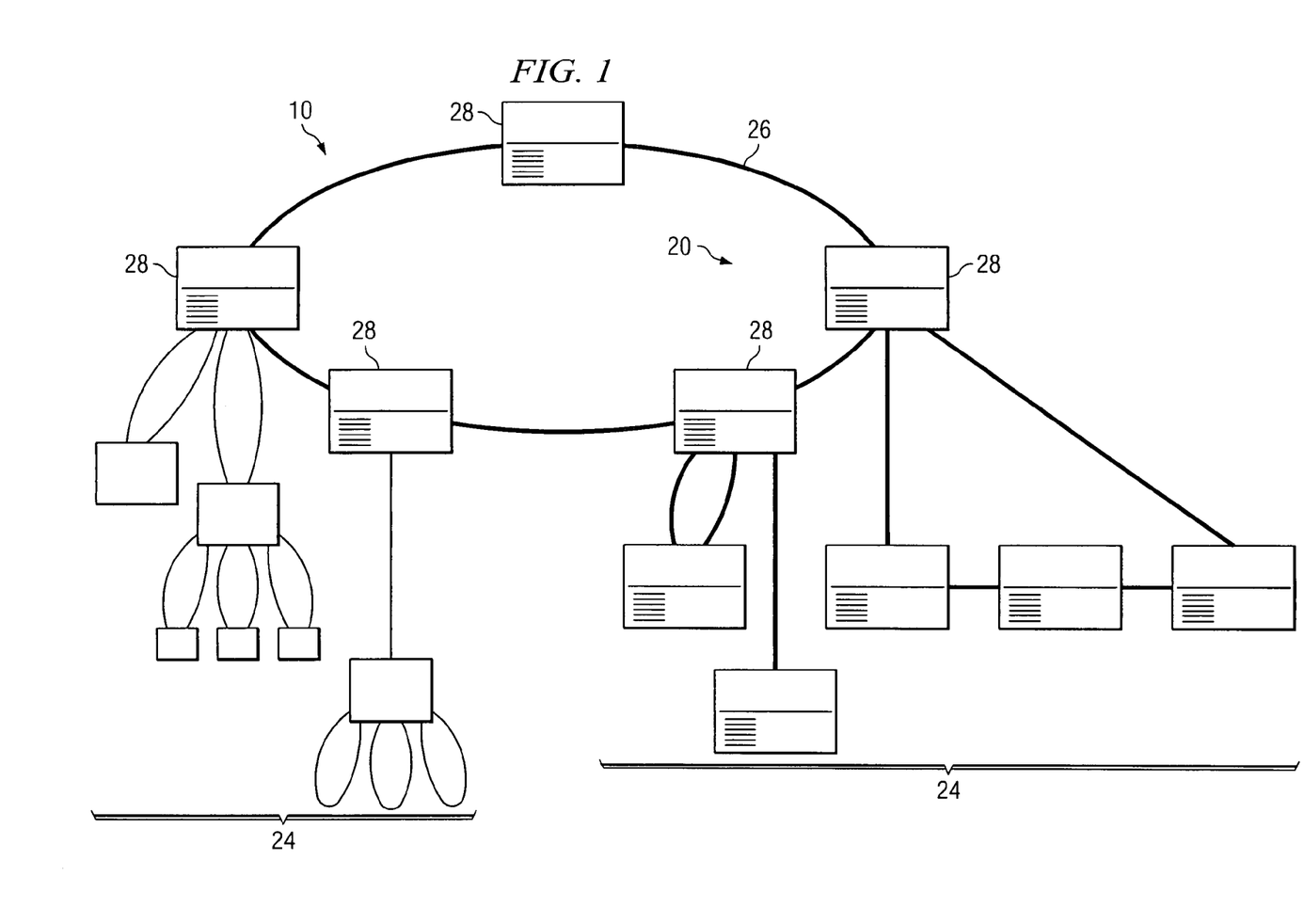
FIG. 1 is a block diagram illustrating one embodiment of a network that includes a node that may use photon absorption methods to detect the waveform of modulated optical signals.

FIG. 1 is a block diagram illustrating one embodiment of a network 10 that includes a node that may use photon absorption methods to detect the waveform of optical signals modulated by one or more optical modulators. Certain changes in the waveform of the modulated signal may indicate variation in the modulation alignment of multiple optical modulators, so the waveform may be used to monitor modulation alignment variation. In addition, certain changes in the waveform of the modulated signal may indicate variation in the bias point of an optical modulator, so the waveform may be used to monitor bias point variation.

According to the illustrated embodiment, network 10 communicates using signals. A signal may refer to an optical signal transmitted as light pulses comprising photons. An optical signal may have a frequency of approximately 1550 nanometers, and a data rate of, for example, 10, 20, 40, or over 40 gigabits per second. A signal may be modulated according to any suitable modulation technique, such as a non return-to-zero (NRZ), return-to-zero (RZ), carrier suppressed return-to-zero (CS-RZ), CS-RZ differential phase shifted keying (DPSK), or other suitable on/off keying (OOK) modulation technique. A signal typically includes one or more components, where a component refers to a portion of light having a specific wavelength or wavelength range.

A signal may communicate information in packets. A packet may comprise a bundle of data organized in a specific way for transmission, and a frame may comprise the payload of one or more packets organized in a specific way for transmission. A packet may carry any suitable information such as voice, data, audio, video, multimedia, other information, or any combination of the preceding. The packets may comprise any suitable multiplexed packets, such time division multiplexed (TDM) packets, communicated using any suitable protocol such as the Ethernet over synchronous optical network (SONET) protocol.

Network 10 includes a ring 20 coupled to access equipment 24 as shown. A ring may refer to a network of communication devices that has a ring topology. According to one embodiment, ring 20 may comprise an optical fiber ring. For example, ring 20 may comprise a resilient packet ring (RPR).

Ring 20 has nodes 28 coupled by fibers 26. A node may refer to a point of a ring at which packets may be communicated to another node. A node 28 may have a transmitter that includes an optical modulator, such as a Mach-Zehnder modulator. Photon absorption methods may be used to detect the waveform of optical signals modulated by one or more optical modulators.

Signals that drive optical modulators typically should be aligned in time in order to properly modulate signals. Modulation alignment may refer to the temporal alignment of the driving signals. The relative delay between the driving signals, however, may vary. Modulation alignment variation may refer to the change in the relative delay. Certain changes in the waveform of the modulated signal may indicate modulation alignment variation. Accordingly, modulation alignment variation may be monitored by detecting the waveform. Example transmitters operable to monitor modulation alignment variation are described in more detail with reference to FIGS. 2 through 5.

Optical modulators are typically biased at bias points. Common bias points may include the null points or the quadrature points of the optical power. A bias point, however, may change. Certain changes in the waveform of the modulated signal may indicate variation in the bias point of an optical modulator. Accordingly, bias points may be monitored by detecting the waveform. An example transmitter operable to monitor bias points variation is described in more detail with reference to FIGS. 6 through 8.

Fibers 26 may refer to any suitable fiber operable to transmit a signal. According to one embodiment, a fiber 26 may represent an optical fiber. An optical fiber typically comprises a cable made of silica glass or plastic. The cable may have an outer cladding material around an inner core. The inner core may have a slightly higher index of refraction than the outer cladding material. The refractive characteristics of the fiber operate to retain a light signal inside of the fiber.

Access equipment 24 may include any suitable device operable to communicate with nodes 28 of ring 20. Examples of access equipment 24 include access gateways, endpoints, softswitch servers, trunk gateways, networks, access service providers, Internet service providers, or other device operable to communicate with nodes 28 of ring 20.

Modifications, additions, or omissions may be made to network 10 without departing from the scope of the invention. The components of network 10 may be integrated or separated according to particular needs. Moreover, the operations of network 10 may be performed by more, fewer, or other devices. Additionally, operations of network 10 may be performed using any suitable logic. Logic may refer to hardware, software, or any combination of hardware and software. As used in this document, "each" refers to each member of a set or each member of a subset of a set.

Figure 2:
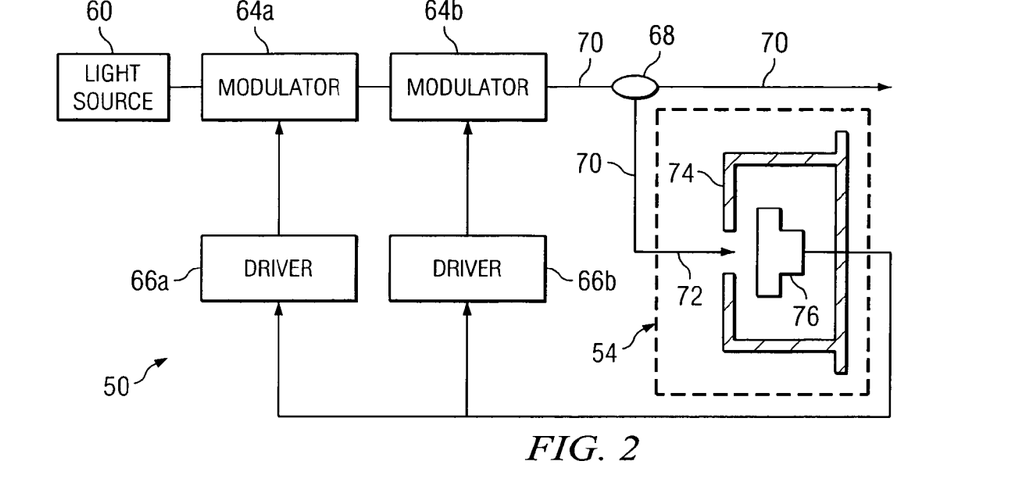
FIG. 2 is a block diagram of one embodiment of a transmitter that includes an alignment monitor operable to monitor modulation alignment variation.

FIG. 2 is a block diagram of one embodiment of a transmitter 50 that includes an alignment monitor 54 operable to monitor modulation alignment variation. According to the illustrated embodiment, transmitter 50 includes a light source 60, optical modulators 64*a-b*, modulator drivers 66*a-b*, an optical coupler 68, fibers 70, and alignment monitor 54 coupled as shown.

In operation, light source 60 generates an optical signal. Optical modulators 64 modulate the signal, and optical coupler 68 taps a portion of the modulated signal for alignment monitor 54. Alignment monitor 54 monitors the modulation alignment variation, and sends feedback to modulator drivers 68 that indicates the modulation alignment variation. Modulator drivers 66 may adjust optical modulators 64 in response to the feedback.

According to the illustrated embodiment, light source 60 generates a light beam, and may comprise a laser. An optical modulator 64*a-b* modulates optical signals, and is driven by driving signals provided by a modulator driver 66*a-b*. Driving signals may include, for example, data signals and clock signals. An optical modulator 64*a-b* may translate electrical information into optical information. As an example, a data signal communicating information may drive optical modulator 64 to yield a modulated signal that communicates the information.

Optical coupler 68 taps a portion of the signal for alignment monitor 54. Optical coupler 68 may comprise a polarization maintaining optical coupler. Fibers 70 transmit optical signal, and may comprise polarization maintaining optical fibers.

According to the illustrated embodiment, alignment monitor 54 includes a fiber 72 and a waveform detector 74 with photon reactive material 76 arranged as shown. Fiber 72 may comprise a tapered optical fiber operable to focus the signal towards photon reactive material 76. Photon reactive material 76 may comprise material that may produce a reaction when a predetermined number of photons arrive at the material. For example, the material may release an electron when a predetermined number of photons, such as two photons, arrive at substantially the same time at substantially the same place of the material. Substantially the same place may refer to the area in which the number of photons may arrive to produce the reaction. Substantially the same time may refer to the time period in which the number of photons may arrive to produce the reaction. More photons arriving at material 76 increases the probability that the predetermined number of photons arrive at substantially the same time, thus increasing the number of reactions.

Photon reactive material 76 may be used to monitor the waveform of the optical signal. A pulse with a narrower waveform shape may include more photons that arrive at material 76 at the same time, and a pulse with a wider waveform shape may include fewer photons that arrive at material 76 at the same time. Since a pulse with a narrower waveform includes more photons that arrive at material 76 at the same time, a narrower waveform pulse may generate more reactions than a wider waveform pulse. Accordingly, the reactions may comprise feedback that indicates the waveform of the signal.

The material may be selected to respond to a predetermined number of photons. According to one embodiment, the material may be selected such that the band gap energy $E_g$ of the material may react to a number n of photons having photon energy hv. To detect n photons, a material with a band gap energy $E_g$ may be selected according to Equation (8):

$$(n-1)h\nu \leq E_g \leq nh\nu \tag{8}$$

For example, a material with an energy $E_g$ may be selected according to Equation (9) to detect two photons:

$$h\nu \leq E_g \leq 2h\nu \tag{9}$$

According to one embodiment, detector 76 may comprise a photodiode such as a silicon avalanche photodiode. A silicon avalanche photodiode comprises a semiconductor material such as silicon. Silicon may release an electron when two photons arrive at substantially the same time at substantially the same place. That is, two photons may generate one electron-hole pair. The photon current is proportional to the square of the input power.

Alignment monitor 54 measures the reactions occurring at detector 74 to monitor modulation alignment variation. A change in the number of reactions may indicate a change in modulation alignment. According to one embodiment, a detector signal from detector 74*a* may be used to detect a change in the number of reactions. Example detector signals are described with reference to FIGS. 3A and 3B.

Figure 3A:
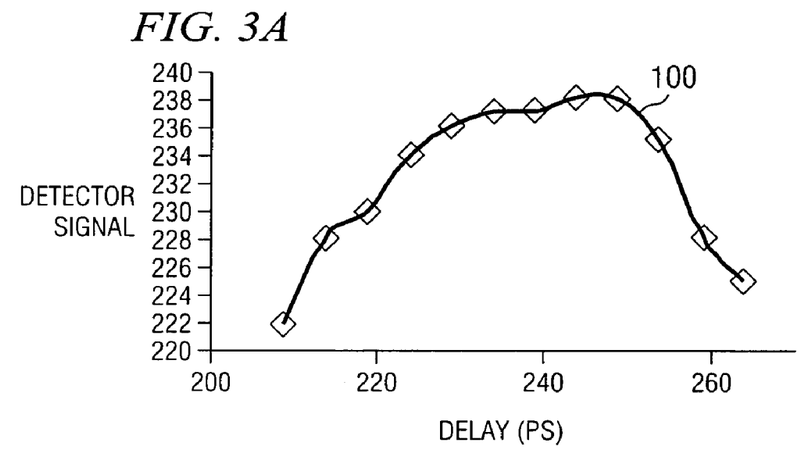
FIGS. 3A and 3B illustrate example detector signals.
Figure 3B:
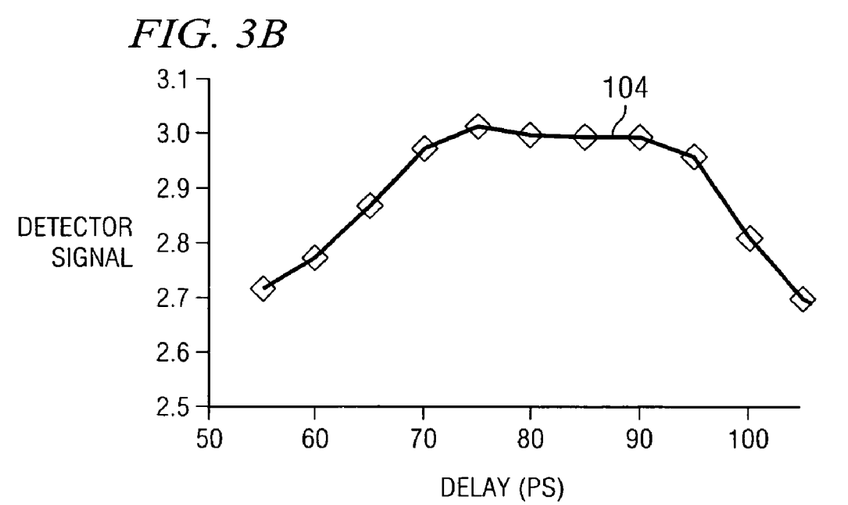

FIGS. 3A and 3B illustrate example detector signals 100 and 104, respectively. Detector signal 100 results from monitoring a carrier suppressed return-to-zero modulated signal. Detector signal 104 results from monitoring a return-to-zero modulated signal.

Referring back to FIG. 2, alignment monitor 54 may inform modulator drivers 68 of the alignment variation. As an example, alignment monitor 54 may send the detector signal to modulator drivers 68. Modulator drivers 68 may adjust optical modulators 64 to compensate for weaker alignment.

Modifications, additions, or omissions may be made to alignment monitor 54 without departing from the scope of the invention. The components of alignment monitor 54 may be integrated or separated according to particular needs. Moreover, the operations of alignment monitor 54 may be performed by more, fewer, or other components.

Figure 4:
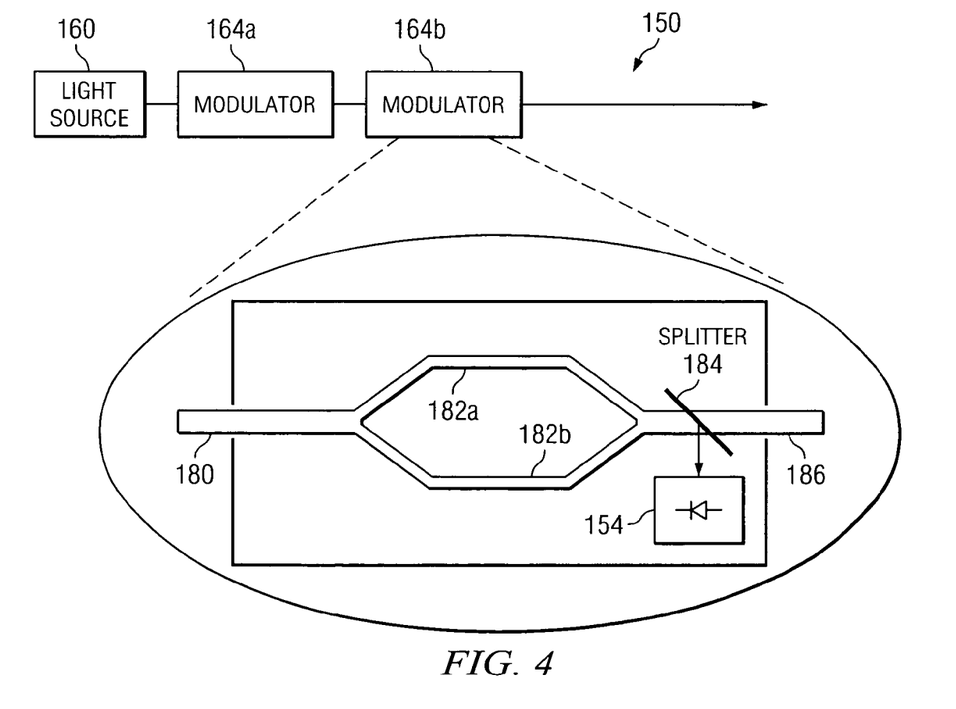
FIG. 4 is a block diagram of a transmitter that includes another embodiment of an alignment monitor.

FIG. 4 is a block diagram of a transmitter 150 that includes another embodiment of an alignment monitor 154 operable to monitor modulation alignment variation. According to the illustrated embodiment, alignment monitor 154 is integrated with optical modulator 164b. According to the embodiment, optical modulator 164b includes input 180, signal paths 182a-b, a splitter 184, a modulator output 186, and alignment monitor 154.

Input 180 receives an optical signal to be modulated. The input signal is split into signals, for example, linearly polarized signal components. A first signal is transmitted along signal path 182a, and a second signal is transmitted along signal path 182b. Optical modulator 164b may change phase of the first and second signals change the refractive index of the signals such that the signals either constructively or destructively interfere. Single components that constructively interfere are transmitted through modulator output 186.

Splitter 184 splits a portion of the modulated signal for alignment monitor 154, and may comprise any suitable beam splitter. Alignment monitor 154 detects the waveform of the signal to monitor modulation alignment variation, and may be substantially similar to alignment monitor 154 of FIG. 2.

Modifications, additions, or omissions may be made to alignment monitor 154 without departing from the scope of the invention. The components of alignment monitor 154 may be integrated or separated according to particular needs. Moreover, the operations of alignment monitor 154 may be performed by more, fewer, or other components.

Figure 5:
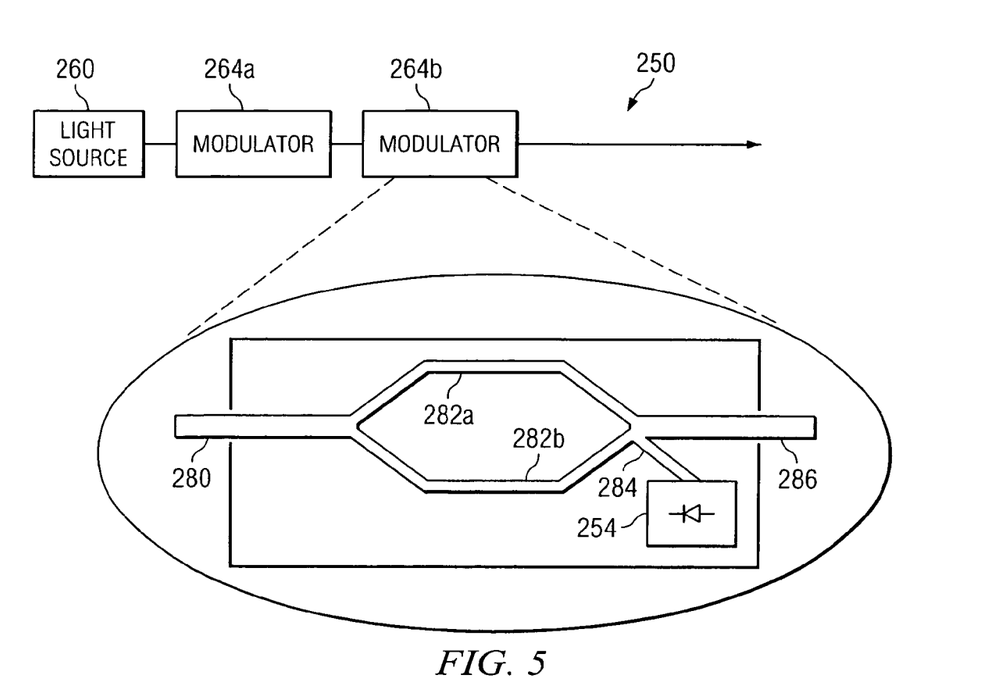
FIG. 5 is a block diagram a transmitter that includes another embodiment of an alignment monitor.

FIG. 5 is a block diagram a transmitter 250 that includes another embodiment of an alignment monitor 254 operable to monitor modulation alignment variation. According to the illustrated embodiment, alignment monitor 254 is integrated with optical modulator 264b. According to the embodiment, optical modulator 264b includes input 280, signal paths 282a-b, a destructive interference output 284, a modulator output 286, and alignment monitor 254.

Input 280 receives an optical signal to be modulated. The input signal is split into signals. A first signal is transmitted along signal path 282a, and a second signal is transmitted along signal path 282b. Optical modulator 264b combines the signals to either constructively or destructively interfere. Signal components that destructively interfere are transmitted along a destructive interference output 284. Single components that constructively interfere are transmitted through modulator output 286.

Alignment monitor 254 receives the signal from destructive interference output 284. Alignment monitor 154 detects the waveform of the signal to monitor modulation alignment variation, and may be substantially similar to alignment monitor 254 of FIG. 2.

Modifications, additions, or omissions may be made to alignment monitor 254 without departing from the scope of the invention. The components of alignment monitor 254 may be integrated or separated according to particular needs. Moreover, the operations of alignment monitor 254 may be performed by more, fewer, or other components.

Figure 6:
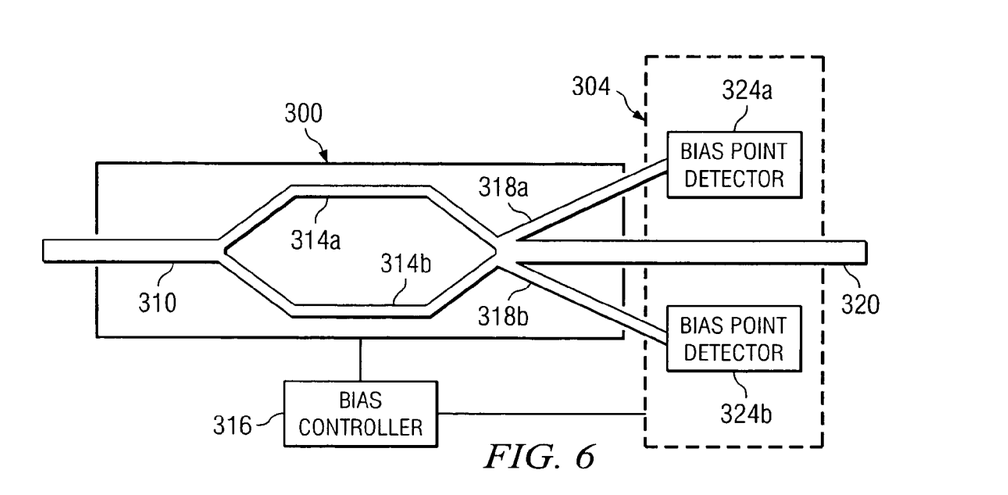
FIG. 6 is a block diagram of one embodiment of an optical modulator, a bias point monitor, and a bias controller.

FIG. 6 is a block diagram of one embodiment of an optical modulator 300, a bias point monitor 304, and a bias controller 316 coupled as shown. In operation, optical modulator 300 modulates an optical signal. Bias point monitor 304 detects the waveform of the modulated signal to monitor the bias point of optical modulator 300. Bias point monitor 304 provides feedback that indicates bias point variation to bias controller 316. Bias controller 316 adjusts optical modulator 300 in response to the feedback to compensate for the bias point variation.

In general, a modulator is typically biased at a particular point depending upon the modulation technique and the format of the data. For example, the bias point may be at quadrature for non return-to-zero modulation. As another example, the bias point for a half data rate clock signal may be at null and the bias point for the data may be at quadrature for carrier suppressed return-to-zero modulation. The bias point may drift in response to temperature variation, and a bias point monitor may be used to monitor the variation.

According to the illustrated embodiment, optical modulator 300 includes an input 310, signal paths 314a-b, destructive interference outputs 318a-b, and optical modulator output 320. Input 310 receives an optical signal to be modulated. The input signal is split into signals. A first signal is transmitted along signal path 314a, and a second signal is transmitted along signal path 314b. Optical modulator 300 combines the signals to either constructively or destructively interfere. Signals that destructively interfere are transmitted along a destructive interference output 318, and signals that constructively interfere are transmitted through optical modulator 320.

Bias point monitor 304 monitors the bias point of optical modulator 300. Bias point monitor 304 includes one or more bias point detectors 324. According to the illustrated example, bias point monitor 304 includes bias point detectors 324a-b. A bias point detector 324 receives a signal from destructive interference output 318. According to the illustrated embodiment, bias point detector 324a receives the signal from destructive interference output 318a, and bias point detector 324b receives the signals from destructive interference output 318b.

According to one embodiment, bias point detector 324a comprises a waveform detector that detects the waveform of the signal. According to the embodiment, the waveform detector may be substantially similar to the photon detector 74 of FIG. 2. Bias point detector 324b comprises an optical power detector that detects the optical power of the signal. As an example, bias point detector 324b may comprise a photodiode or other device operable to monitor the optical power of the signal.

The waveform may provide a more precise indication of the bias point than the optical power. As an example, a more detectable peak of the waveform may indicate a bias point, whereas a less detectable quadrature of the optical power may indicate the bias point. Accordingly, bias point detector 324a may provide more precise monitoring than bias point detector 324b. An example of detector signals from bias point detector 324b and bias point detector 324b are described in more detail with reference to FIG. 7.

Modifications, additions, or omissions may be made to bias point monitor 304 without departing from the scope of the invention. The components of bias point monitor 304 may be integrated or separated according to particular needs. Moreover, the operations of bias point monitor 304 may be performed by more, fewer, or other components.

Figure 7:
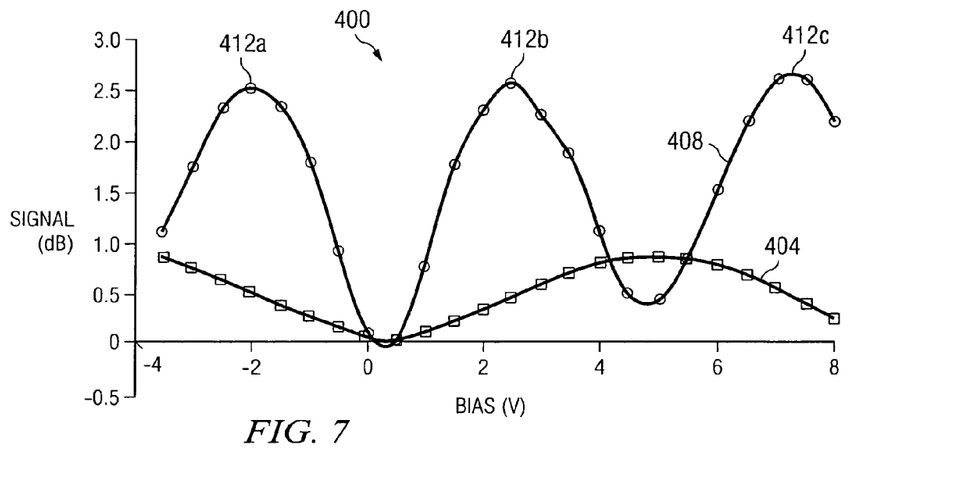
FIG. 7 is a diagram illustrating example detector signals from a waveform detector and from an optical power detector.

FIG. 7 is a diagram 400 illustrating example detector signals 404 and 408 from a waveform detector and from an optical power detector. Example detector signals 404 and 408 result from detection of a 20 gigabits per second return-to-zero modulated signal, driven by a clock signal and a data signal. Detector signal 404 represents the output of an optical power detector, and detector signal 408 represents the output of a waveform detector. According to the example, bias points 412 may be more readily identified using detector signal 408 from a waveform detector.

Figure 8:
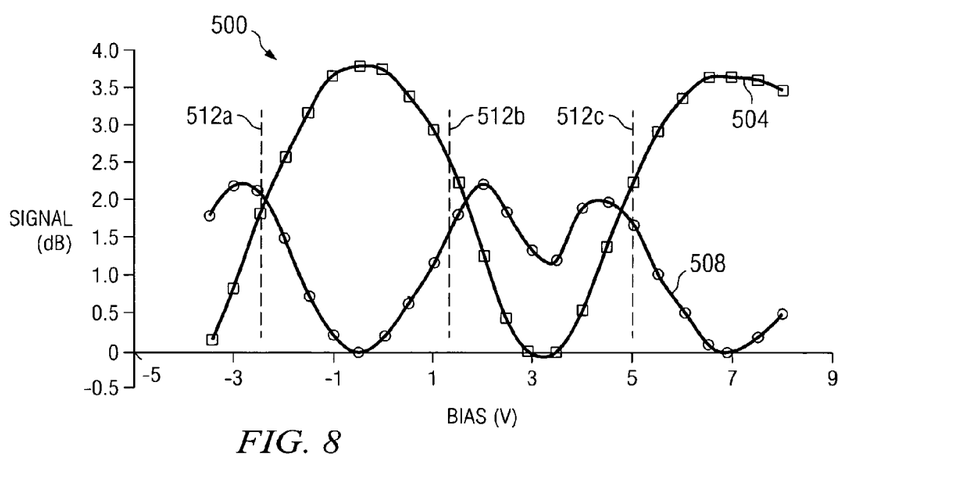
FIG. 8 is a diagram illustrating example detector signals from a waveform detector and from an optical power detector.

FIG. 8 is a diagram 500 illustrating example detector signals 504 and 508 from a waveform detector and from an optical power detector. Example detector signals 504 and 508 result from detection of a single Mach-Zehnder (MZ) modulated signal, driven by a clock signal. Detector signal 504 represents the output of an optical power detector, and detector signal 508 represents the output of a waveform detector. According to the example, bias points 512 may be more readily identified using detector signal 508 from a waveform detector.

Certain embodiments of the invention may provide one or more technical advantages. A technical advantage of one embodiment may be that modulation alignment variation may be monitored by detecting the waveform of the modulated signal. According to the embodiment, certain changes in the waveform of the modulated signal may indicate variation in the modulation alignment. Another technical advantage of one embodiment may be that the changes in the waveform is independent of the data rate, so modulation alignment variation may be monitored for any suitable data rate. Yet another technical advantage of one embodiment may be that the changes in the waveform is independent of the wavelength, so modulation alignment variation may be monitored for any suitable wavelength.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. An alignment monitor operable to monitor modulation alignment variation of a plurality of optical modulators, comprising:
   an input fiber operable to:
      receive an optical signal comprising a plurality of photons, the optical signal modulated by a plurality of optical modulators, the plurality of optical modulators driven by a plurality of drive signals;
   a photon detector comprising a photon reactive material operable to:
      produce a reaction in response to the arrival of a predetermined number of photons, photons, a band gap energy of the photon reactive material being greater than or equal to a photon energy and less than or equal to two times the photon energy;
      receive the plurality of photons of the optical signal;
      produce a plurality of reactions in response to the arrival of the plurality of photons; and
      generate feedback in response to the plurality of reactions, the feedback reflecting the waveform of the optical signal, the feedback indicating modulation alignment variation among the plurality of optical modulators, the modulation alignment variation indicating a change in a relative delay between the plurality of drive signals; and
   a modulator driver operable to:
      receive a detector signal reflecting the feedback; and
      adjust at least one of the plurality of optical modulators in accordance with the feedback to compensate for weaker modulation alignment.

2. The alignment monitor of claim 1, wherein the photon reactive material comprises a material operable to release an electron when two photons arrive at substantially the same time at substantially the same place of the material.

3. The alignment monitor of claim 1, wherein the photon reactive material comprises silicon.

4. The alignment monitor of claim 1, wherein the feedback indicating modulation alignment variation reflects a change in the number of reactions.

5. The alignment monitor of claim 1, wherein an optical modulator of the plurality of optical modulators comprises:
   the input fiber; and
   the photon reactive material.

6. The alignment monitor of claim 1, wherein the input fiber is further operable to receive the optical signal from the plurality of optical modulators.

7. The alignment monitor of claim 1, wherein an optical modulator of the plurality of optical modulators further comprises a splitter operable to:
   direct a portion of the optical signal to the input fiber.

8. The alignment monitor of claim 1, wherein an optical modulator of the plurality of optical modulators further comprises a destructive interference output operable to:
   direct one or more destructively interfered signals of the optical signal to the input fiber.

9. A method for monitoring modulation alignment variation of a plurality of optical modulators, comprising:
   receiving at an input fiber an optical signal comprising a plurality of photons, the optical signal modulated by a plurality of optical modulators, the plurality of optical modulators driven by a plurality of drive signals;
   receiving the plurality of photons of the optical signal at a photonic detector comprising a photon reactive material, the photon reactive material operable to produce a reaction in response to the arrival of a predetermined number of photons, photons, a band gap energy of the photon reactive material being greater than or equal to a photon energy and less than or equal to two times the photon energy;
   producing a plurality of reactions in response to the arrival of the plurality of photons; and
   generating feedback in response to the plurality of reactions, the feedback reflecting the waveform of the optical signal, the feedback indicating modulation alignment variation among the plurality of optical modulators, the modulation alignment variation indicating a change in a relative delay between the plurality of drive signals;
   receiving a detector signal reflecting the feedback; and
   adjusting at least one of the plurality of optical modulators in accordance with the feedback to compensate for weaker modulation alignment.

10. The method of claim 9, wherein the photon reactive material comprises a material operable to release an electron when two photons arrive at substantially the same time at substantially the same place of the material.

11. The method of claim 9, wherein the photon reactive material comprises silicon.

12. The method of claim 9, wherein the feedback indicating modulation alignment variation reflects a change in the number of reactions.

13. The method of claim 9, further comprising:
receiving a detector signal reflecting the feedback; and
adjusting at least one of the plurality of optical modulators in accordance with the feedback.

14. The method of claim 9, wherein an optical modulator of the plurality of optical modulators comprises:
the input fiber; and
the photon reactive material.

15. The method of claim 9, wherein receiving the optical signal comprising the plurality of photons further comprises:
receiving the optical signal from the plurality of optical modulators.

16. The method of claim 9, further comprising:
directing a portion of the optical signal to the input fiber using a splitter of an optical modulator of the plurality of optical modulators.

17. The method of claim 9, further comprising:
directing one or more destructively interfered signals of the optical signal to the input fiber using a destructive interference output of an optical modulator of the plurality of optical modulators.

18. A system for monitoring modulation alignment variation of a plurality of optical modulators, comprising:
means for receiving at an input fiber an optical signal comprising a plurality of photons, the optical signal modulated by a plurality of optical modulates; the plurality of optical modulators driven by a plurality of drive signals;
means for receiving the plurality of photons of the optical signal at a photon detector comprising a photon reactive material, the photon reactive material operable to produce a reaction in response to the arrival of a predetermined number of photons; photons, a band gap energy of the photon reactive material being greater than or equal to a photon energy and less than or equal to two times the photon energy;
means for producing a plurality of reactions in response to the arrival of the plurality of photons; and
means for generating feedback in response to the plurality of reactions, the feedback reflecting the waveform of the optical signal, the feedback indicating modulation alignment variation among the plurality of optical modulators, the modulation alignment variation indicating a change in a relative delay between the plurality of drive signals;
means for receive a detector signal reflecting the feedback; and
means for adjust at least one of the plurality of optical modulators in accordance with the feedback to compensate for weaker modulation alignment.

19. A system comprising:
a plurality of optical modulators driven by a plurality of drive signals;
a plurality of alignment monitors, an alignment monitor operable to monitor modulation alignment variation of at least one of the plurality of optical modulators, an alignment monitor comprising:
an input fiber operable to:
receive an optical signal comprising a plurality of photons, the optical signal modulated by the plurality of optical modulators; and
a photon reactive material comprising a material operable to release an electron when two photons arrive at substantially the same time at substantially the same place of the material, the photon reactive material comprises silicon, the photon reactive material operable to:
produce a reaction in response to the arrival of a predetermined number of photons, a band gap energy of the photon reactive material being greater than or equal to a photon energy and less than or equal to two times the photon energy;
receive the plurality of photons of the optical signal;
produce a plurality of reactions in response to the arrival of the plurality of photons; and
generate feedback in response to the plurality of reactions, the feedback reflecting the waveform of the optical signal, the feedback indicating modulation alignment variation among the plurality of optical modulators, the modulation alignment variation indicating a change in a relative delay between the plurality of drive signals, the feedback indicating modulation alignment variation reflecting a change in the number of reactions;
a plurality of modulator drivers, a modulator driver operable to:
receive a detector signal reflecting the feedback; and
adjust an optical modulator of the plurality of optical modulators in accordance with the feedback to compensate for weaker modulation alignment;
a first optical modulator of the plurality of optical modulators, the first optical modulator comprising:
a first input fiber; and
a first photon reactive material;
a second optical modulator of the plurality of optical modulators, the second optical modulator comprising a splitter operable to:
direct a portion of the optical signal to the input fiber; and
a third optical modulator of the plurality of optical modulators, the third optical modulator comprising a destructive interference output operable to:
direct one or more destructively interfered signals of the optical signal to the input fiber.

* * * * *